United States Patent
Yang et al.

(10) Patent No.: US 10,600,881 B2
(45) Date of Patent: Mar. 24, 2020

(54) TUNNELING FIELD-EFFECT TRANSISTOR AND FABRICATION METHOD THEREOF

(71) Applicant: HUAWEI TECHNOLOGIES CO., LTD., Shenzhen, Guangdong (CN)

(72) Inventors: Xichao Yang, Shenzhen (CN); Chen-Xiong Zhang, Plano, TX (US)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/125,902

(22) Filed: Sep. 10, 2018

(65) Prior Publication Data

US 2019/0013413 A1 Jan. 10, 2019

Related U.S. Application Data

(63) Continuation of application No. PCT/CN2016/079994, filed on Apr. 22, 2016.

(51) Int. Cl.
*H01L 29/423* (2006.01)
*H01L 29/739* (2006.01)
(Continued)

(52) U.S. Cl.
CPC .... *H01L 29/42392* (2013.01); *H01L 21/3081* (2013.01); *H01L 21/823418* (2013.01);
(Continued)

(58) Field of Classification Search
CPC ..... H01L 29/0665; H01L 29/0669–068; H01L 29/7853–2029/7858; H01L 29/78687;
(Continued)

(56) References Cited

U.S. PATENT DOCUMENTS 9,087,922 B2 * 7/2015 Sun ................ H01L 21/823487
9,142,641 B1 9/2015 Lin et al.
(Continued)

FOREIGN PATENT DOCUMENTS

| CN | 102484132 A | 5/2012 |
|---|---|---|
| CN | 104157687 A | 11/2014 |
| TW | 200739905 A | 10/2007 |
| TW | 201612960 A | 4/2016 |

OTHER PUBLICATIONS

International Search Report issued in International Application No. PCT/CN2016/079994 dated Jan. 26, 2017, 7 pages.
(Continued)

*Primary Examiner* — Scott B Geyer
(74) *Attorney, Agent, or Firm* — Fish & Richardson P.C.

(57) ABSTRACT

The present disclosure relates to a tunneling field-effect transistor and a fabrication method. One example transistor includes a semiconductor substrate, a semiconductor nanosheet, a source region and a drain region, a dielectric layer, and a gate metal layer. The semiconductor nanosheet is vertically disposed on the semiconductor substrate. The source region and the drain region are connected using a channel. The drain region, the channel, and the source region are disposed on the semiconductor nanosheet in turn. The drain region is in contact with the semiconductor substrate. The source region is located at an end, of the semiconductor nanosheet, far away from the semiconductor substrate. The dielectric layer comprises at least a gate dielectric layer, is disposed on a surface of the semiconductor nanosheet, and surrounds the channel. The gate metal layer is disposed on a surface of the gate dielectric layer and surrounds the gate dielectric layer.

12 Claims, 8 Drawing Sheets

(51) Int. Cl.
- *H01L 29/775* (2006.01)
- *H01L 29/06* (2006.01)
- *H01L 21/8234* (2006.01)
- *H01L 21/308* (2006.01)
- *H01L 29/66* (2006.01)
- *H01L 29/786* (2006.01)

(52) U.S. Cl.
CPC .... *H01L 21/823431* (2013.01); *H01L 29/068* (2013.01); *H01L 29/0665* (2013.01); *H01L 29/0676* (2013.01); *H01L 29/66742* (2013.01); *H01L 29/7391* (2013.01); *H01L 29/775* (2013.01); *H01L 29/78642* (2013.01); *H01L 29/78696* (2013.01)

(58) Field of Classification Search
CPC ......... H01L 29/78696; H01L 29/42392; H01L 21/823431; H01L 21/823418
See application file for complete search history.

(56) References Cited

U.S. PATENT DOCUMENTS

| | | | |
|---|---|---|---|
| 9,385,195 B1* | 7/2016 | Zhang | H01L 29/1033 |
| 9,530,866 B1* | 12/2016 | Zhang | H01L 29/66666 |
| 9,613,955 B1* | 4/2017 | Anderson | H01L 27/0886 |
| 2007/0052012 A1 | 3/2007 | Forbes | |
| 2007/0228491 A1 | 10/2007 | Forbes | |
| 2009/0008631 A1 | 1/2009 | Hurkx et al. | |
| 2011/0049474 A1 | 3/2011 | Bjoerk et al. | |
| 2014/0054711 A1 | 2/2014 | Chuang et al. | |
| 2015/0372083 A1* | 12/2015 | Tang | H01L 29/42392 257/9 |

OTHER PUBLICATIONS

Taiwan Office Action issued in Taiwan Application No. 10620884630 dated Aug. 30, 2017, 9 pages.
Taiwan Office Action issued in Taiwan Application No. 10720342240 dated Apr. 23, 2018, 9 pages.

* cited by examiner

TUNNELING FIELD-EFFECT TRANSISTOR AND FABRICATION METHOD THEREOF

CROSS-REFERENCE TO RELATED APPLICATIONS

This application is a continuation of International Application No. PCT/CN2016/079994, filed on Apr. 22, 2016, the disclosure of which is hereby incorporated by reference in its entirety.

TECHNICAL FIELD

The present application relates to the field of electronic technologies, and in particular, to a tunneling field-effect transistor and a fabrication method thereof.

BACKGROUND

According to Moore's Law, a size of a transistor gradually decreases, and when the size decreases to a nanometer scale, a serious short-channel effect is induced, resulting in performance deterioration of the transistor. Therefore, how to suppress the short-channel effect has become an important research topic in the art.

A gate-all-around technology can improve a gate control capability by using a gate-all-around transistor channel, and is a common solution to suppression of the short-channel effect. Generally, a semiconductor nanowire is suitable for being used in a gate-all-around transistor structure. A source region, a channel, and a drain region may be disposed on the nanowire, a gate dielectric layer is disposed on a surface of the nanowire, and a gate metal layer is disposed on a surface of the gate dielectric layer. In this way, the gate-all-around structure is formed. In addition, considering that the nanowire features a high parasitic resistance and a small on-state current, parallel processing may be performed on a plurality of nanowires to obtain a stronger current driving capability. However, parallel connection of the plurality of nanowires increases circuit design complexity and fabrication complexity. In addition, due to a relatively small diameter, the nanowire has a quite high aspect ratio and low mechanical stability.

SUMMARY

To resolve a technical problem existing in the art, embodiments of the present application provide a tunneling field-effect transistor and a fabrication method thereof. Technical solutions are as follows:

According to a first aspect, an embodiment of the present application provides a tunneling field-effect transistor, where the tunneling field-effect transistor includes:

a semiconductor substrate;

a semiconductor nanosheet, vertically disposed on the semiconductor substrate;

a source region and a drain region, where the source region and the drain region are connected by using a channel, the drain region, the channel, and the source region are disposed on the semiconductor nanosheet in turn, the drain region is in contact with the semiconductor substrate, and the source region is located at an end, of the semiconductor nanosheet, far away from the semiconductor substrate;

a dielectric layer, where the dielectric layer includes at least a gate dielectric layer, and the dielectric layer is disposed on a surface of the semiconductor nanosheet and surrounds the channel; and a gate metal layer, disposed on a surface of the gate dielectric layer and surrounding the gate dielectric layer, where the gate dielectric layer and the gate metal layer constitute a gate region, and the gate region controls tunneling of carriers in the tunneling field-effect transistor through an electric field to form an on-state and an off-state of a device.

In a first possible implementation of the first aspect, a thickness of the semiconductor nanosheet is less than 15 nanometers.

In a second possible implementation of the first aspect, the source region is formed by performing first-type doping, the drain region is formed by performing second-type doping, and first-type doping is opposite to second-type doping; and the channel is formed by performing first-type doping or is formed by performing second-type doping.

First-type doping is N-type doping, and second-type doping is P-type doping; or first-type doping is P-type doping, and second-type doping is N-type doping.

In a third possible implementation of the first aspect, a doping concentration of the source region is not less than $10^{20}$ cm$^{-3}$; a doping concentration of the drain region is $10^{17}$-$5\times10^{19}$ cm$^{-3}$; and a doping concentration of the channel is $10^{13}$-$10^{17}$ cm$^{-3}$.

In a fourth possible implementation of the first aspect, a thickness of the gate dielectric layer is less than 5 nanometers.

In a fifth possible implementation of the first aspect, the semiconductor substrate includes at least one of the following substrates:

a bulk silicon substrate, a silicon on insulator SOI substrate, a germanium substrate, a III-V compound material substrate, and a substrate formed by stacking a plurality of types of semiconductor materials.

In a sixth possible implementation of the first aspect, the gate dielectric layer is in contact with the source region, and the gate region can modulate a part of the source region through an electric field.

In a seventh possible implementation of the first aspect, the dielectric layer further includes a pocket layer; and that the dielectric layer is disposed on a surface of the semiconductor nanosheet and surrounds the channel includes: the pocket layer is disposed on surfaces of the channel and the source region, surrounds the channel, and is in contact with the source region, and the gate dielectric layer is disposed on a surface of the pocket layer and surrounds the pocket layer.

According to a second aspect, an embodiment of the present application provides a fabrication method of a tunneling field-effect transistor, where the method includes:

providing a semiconductor substrate;

forming semiconductor fins on the semiconductor substrate;

etching the semiconductor fins to obtain semiconductor nanosheets, where the semiconductor nanosheet is vertically disposed;

performing first-type doping on a first substrate of the semiconductor substrate to form a drain region, where the drain region is located above a second substrate of the semiconductor substrate, the first substrate is a part of the semiconductor substrate, is located under the semiconductor nanosheet, and is in contact with the semiconductor nanosheet, and the second substrate is a part, of the semiconductor substrate, remaining after the first substrate is excluded from the semiconductor substrate;

depositing a first dielectric material on the drain region and the second substrate, so that the first dielectric material covers the drain region;

depositing at least one layer of dielectric materials to form a dielectric layer on a surface of the semiconductor nanosheet, where the at least one layer of dielectric materials includes a second dielectric material, the dielectric layer includes at least a gate dielectric layer formed by using the second dielectric material, and the dielectric layer surrounds a channel;

depositing a conductive material to form a gate metal layer on a surface of the gate dielectric layer, where the gate metal layer surrounds the gate dielectric layer; and etching the dielectric layer and the gate metal layer, and performing second-type doping on an exposed part of the nanosheet to form a source region.

In a first possible implementation of the second aspect, the forming semiconductor fins on the semiconductor substrate includes:

depositing a first sacrificial material on the semiconductor substrate, and forming a first sacrificial layer by using a photolithography process and an etching process;

depositing an isolation material on both sides of the first sacrificial layer, and forming isolation walls by using a photolithography process and an etching process; and removing the first sacrificial layer, and etching the semiconductor substrate by using the isolation walls as templates to form the semiconductor fins on the semiconductor substrate.

In a second possible implementation of the second aspect, the etching the semiconductor fins to obtain semiconductor nanosheets includes:

depositing a third dielectric material, and performing polishing processing by using a top of the isolation wall as a reference;

depositing a second sacrificial material on the top of the isolation wall, and forming a second sacrificial layer by using a photolithography process and an etching process; and etching the deposited third dielectric material and the semiconductor fins by using the second sacrificial layer as a template, and sequentially removing the second sacrificial layer and the third dielectric material to obtain the semiconductor nanosheets.

In a third possible implementation of the second aspect, the method further includes:

forming, on the semiconductor substrate, a groove structure with a specific angle by using anisotropic etching, where the groove structure is located between the two isolation walls formed on the semiconductor substrate.

In a fourth possible implementation of the second aspect, after the etching the semiconductor fins to obtain semiconductor nanosheets, the method further includes:

depositing a fifth dielectric material in the groove structure to isolate the two semiconductor nanosheets obtained by using the two semiconductor fins.

In a fifth possible implementation of the second aspect, the etching the dielectric layer and the gate metal layer, and performing second-type doping on an exposed part of the nanosheet to form a source region includes:

depositing a sixth dielectric material, and performing polishing processing;

etching the sixth dielectric material, the gate metal layer, and the dielectric layer to expose the nanosheet; and performing second-type doping on the exposed part of the nanosheet to form the source region.

In a sixth possible implementation of the second aspect, the depositing at least one layer of dielectric materials to form a dielectric layer on a surface of the semiconductor nanosheet includes:

depositing a fourth dielectric material to form a pocket layer on the surface of the semiconductor nanosheet; and depositing the second dielectric material to form the gate dielectric layer on a surface of the pocket layer, where the gate dielectric layer surrounds the pocket layer, and the pocket layer and the gate dielectric layer constitute the dielectric layer.

In a seventh possible implementation of the second aspect, the etching the dielectric layer and the gate metal layer, and performing second-type doping on an exposed part of the nanosheet to form a source region includes:

etching the pocket layer, the gate dielectric layer, and the gate metal layer, and performing second-type doping on the exposed part of the nanosheet to form the source region.

In an eighth possible implementation of the second aspect, after the forming the source region, the method further includes:

depositing a seventh dielectric material, forming a metal contact hole by using a photolithography process, and fabricate a metal electrode separately at the drain region, the gate metal layer, and the source region by using the metal contact hole.

According to a third aspect, an embodiment of the present application provides a fabrication method of a tunneling field-effect transistor, where the method includes:

providing a semiconductor substrate on which a first-type doped semiconductor film, a channel-region semiconductor film, and a second-type doped semiconductor film are sequentially deposited;

forming semiconductor fins above the first-type doped semiconductor film on the semiconductor substrate, where the semiconductor fin includes the channel-region semiconductor film and the second-type doped semiconductor film;

etching the semiconductor fins to obtain semiconductor nanosheets, where the semiconductor nanosheet is vertically disposed;

depositing a first dielectric material on the semiconductor substrate, so that the first dielectric material covers the first-type doped semiconductor film;

depositing at least one layer of dielectric materials to form a dielectric layer on a surface of the semiconductor nanosheet, where the at least one layer of dielectric materials includes a second dielectric material, the dielectric layer includes at least a gate dielectric layer formed by using the second dielectric material, and the dielectric layer surrounds the channel-region semiconductor film;

depositing a conductive material to form a gate metal layer on a surface of the gate dielectric layer, where the gate metal layer surrounds the gate dielectric layer; and etching the dielectric layer and the gate metal layer to expose the second-type doped semiconductor film.

In a first possible implementation of the third aspect, the forming semiconductor fins above the first-type doped semiconductor film on the semiconductor substrate includes:

depositing a first sacrificial material on the semiconductor substrate, and forming a first sacrificial layer by using a photolithography process and an etching process;

depositing an isolation material on both sides of the first sacrificial layer, and forming isolation walls by using a photolithography process and an etching process; and removing the first sacrificial layer, and etching the channel-region semiconductor film and the second-type doped semiconductor film on the semiconductor substrate by using the isolation walls as templates to form the semiconductor fins above the first-type doped semiconductor film.

In a second possible implementation of the third aspect, the etching the semiconductor fins to obtain semiconductor nanosheets includes:

depositing a third dielectric material, and performing polishing processing by using a top of the isolation wall as a reference;

depositing a second sacrificial material on the top of the isolation wall, and forming a second sacrificial layer by using a photolithography process and an etching process; and etching the deposited third dielectric material and the semiconductor fins by using the second sacrificial layer as a template, and sequentially removing the second sacrificial layer and the third dielectric material to obtain the semiconductor nanosheets.

In a third possible implementation of the third aspect, the method further includes:

forming, on the semiconductor substrate, a groove structure with a specific angle by using anisotropic etching, where the groove structure is located between the two isolation walls formed on the semiconductor substrate.

In a fourth possible implementation of the third aspect, after the etching the semiconductor fins to obtain semiconductor nanosheets, the method further includes:

depositing a fifth dielectric material in the groove structure to isolate the two semiconductor nanosheets obtained by using the two semiconductor fins.

In a fifth possible implementation of the third aspect, the etching the dielectric layer and the gate metal layer to expose the second-type doped semiconductor film includes:

filling a sixth dielectric material and performing polishing processing; and etching the sixth dielectric material, the gate metal layer, and the dielectric layer to expose the second-type doped semiconductor film.

In a sixth possible implementation of the third aspect, during etching of the dielectric layer and the gate metal layer, an etching height is equal to a height of the second-type doped semiconductor film, so that the second-type doped semiconductor film is exposed; or during etching of the dielectric layer and the gate metal layer, an etching height is less than a height of the second-type doped semiconductor film, so that the second-type doped semiconductor film is exposed and the dielectric layer is in contact with the second-type doped semiconductor film.

In a seventh possible implementation of the third aspect, the depositing at least one layer of dielectric materials to form a dielectric layer on a surface of the semiconductor nanosheet includes:

depositing a fourth dielectric material to form a pocket layer on the surface of the semiconductor nanosheet; and depositing the second dielectric material to form the gate dielectric layer on a surface of the pocket layer, where the gate dielectric layer surrounds the pocket layer, and the pocket layer and the gate dielectric layer constitute the dielectric layer.

In an eighth possible implementation of the third aspect, the etching the dielectric layer and the gate metal layer includes:

etching the pocket layer, the gate dielectric layer and the gate metal layer to expose the second-type doped semiconductor film.

In a ninth possible implementation of the third aspect, after the etching the dielectric layer and the gate metal layer to expose the second-type doped semiconductor film, the method further includes:

depositing a seventh dielectric material, forming a metal contact hole by using a photolithography process, and fabricating a metal electrode separately at the first-type doped semiconductor film, the gate metal layer, and the second-type doped semiconductor film by using the metal contact hole.

Beneficial effects of the technical solutions provided by the embodiments of the present application are as follows:

According to the tunneling field-effect transistor and the fabrication method thereof that are provided in the embodiments of the present application, the tunneling field-effect transistor is fabricated by using the semiconductor nanosheet instead of a plurality of nanowires connected in parallel. This improves a current driving capability, decreases circuit design complexity and fabrication complexity, simplifies a fabrication process, and reduces process costs. In addition, an aspect ratio of the semiconductor nanosheet is less than that of the nanowire, and therefore mechanical stability of the semiconductor nanosheet is higher than that of the nanowire. This enhances mechanical stability of the tunneling field-effect transistor.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

To make the objectives, technical solutions, and advantages of the present application clearer, the following further describes the embodiments of the present application in detail with reference to the accompanying drawings.

For ease of description, in the present application, there are three directions in three-dimensional space: a first direction, a second direction, and a third direction. A length in the first direction is referred to as a thickness, a length in the second direction is referred to as a width, and a length in the third direction is referred to as a height. An XYZ coordinate system is used as an example. The first direction may be an X direction, the second direction may be a Y direction, and the third direction may be a Z direction.

Embodiment 1

Figure 1:
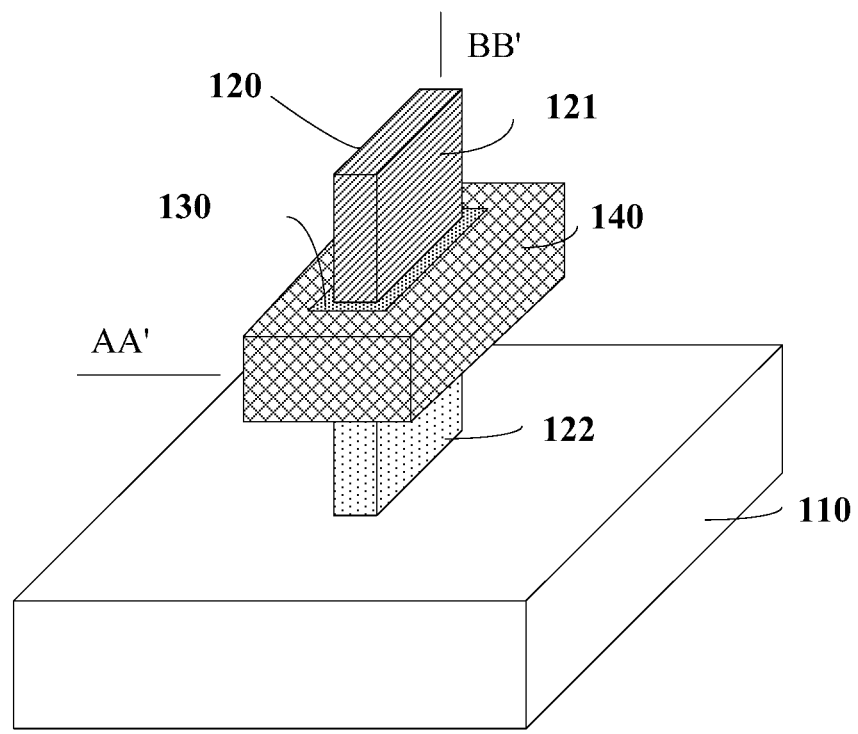
FIG. 1 is a schematic structural diagram of a tunneling field-effect transistor according to Embodiment 1 of the present application.
Figure 2:
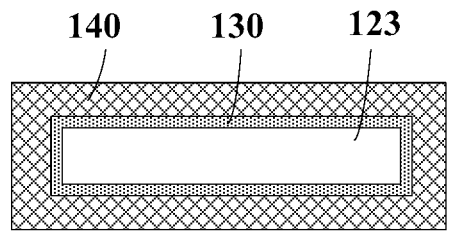
FIG. 2 is a sectional view obtained by cutting the tunneling field-effect transistor according to Embodiment 1 of the present application along an AA' direction in FIG. 1.
Figure 3:
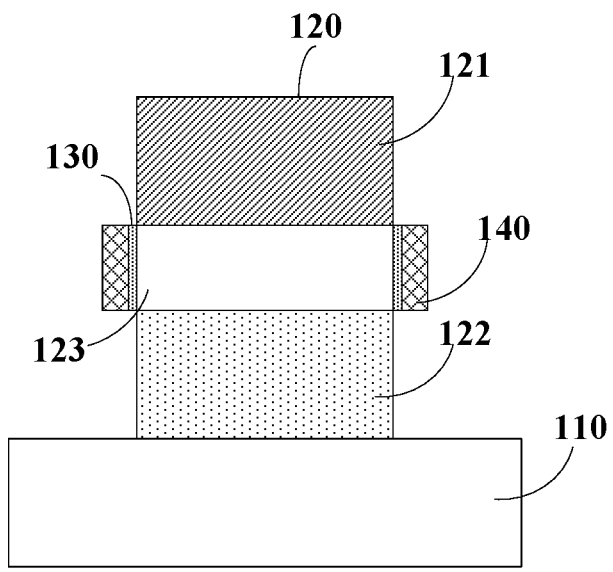
FIG. 3 is a sectional view obtained by cutting the tunneling field-effect transistor according to Embodiment 1 of the present application along a BB' direction in FIG. 1.

FIG. 1 is a schematic structural diagram of a tunneling field-effect transistor according to Embodiment 1 of the present application. FIG. 2 is a sectional view obtained by cutting the tunneling field-effect transistor according to Embodiment 1 of the present application along an AA' direction in FIG. 1. FIG. 3 is a sectional view obtained by cutting the tunneling field-effect transistor according to Embodiment 1 of the present application along a BB' direction in FIG. 1.

Referring to FIG. 1 to FIG. 3, the tunneling field-effect transistor includes a semiconductor substrate 110, a semiconductor nanosheet 120, a source region 121, a drain region 122, a channel 123, a gate dielectric layer 130, and a gate metal layer 140.

The semiconductor nanosheet 120 is vertically disposed on the semiconductor substrate 110. The source region 121 and the drain region 122 are connected by using the channel 123. The drain region 122, the channel 123, and the source region 121 are disposed on the semiconductor nanosheet 120 in turn. The drain region 122 is in contact with the semiconductor substrate 110, and the source region 121 is located on an end, of the semiconductor nanosheet 120, far away from the semiconductor substrate 110.

The gate dielectric layer 130 is disposed on a surface of the semiconductor nanosheet 120 and surrounds the channel 123. The gate metal layer 140 is disposed on a surface of the gate dielectric layer 130 and surrounds the gate dielectric layer 130. The gate dielectric layer 130 and the gate metal layer 140 constitute a gate region, and the gate region controls tunneling of carriers in the tunneling field-effect transistor through an electric field to form an on-state and an off-state of a device. The semiconductor nanosheet 120 is of a flat shape with a width greater than a thickness. In an optional embodiment, the width is much greater than the thickness. For example, the semiconductor nanosheet 120 has a thickness of 10 nanometers and a width of 30 nanometers. Alternatively, the semiconductor nanosheet 120 has a thickness of 10 nanometers and a width of 100 nanometers. No limitation is imposed on a difference between the width and the thickness of the semiconductor nanosheet 120 in this embodiment.

In this embodiment of the present application, the source region 121, the drain region 122, and the channel 123 are disposed on the semiconductor nanosheet 120, without using a manner of connecting a plurality of nanowires in parallel. In this way, not only a current driving capability is improved, but also circuit design complexity and fabrication complexity can be reduced. In addition, an aspect ratio of the semiconductor nanosheet is less than that of the nanowire, and therefore mechanical stability of the semiconductor nanosheet is higher than that of the nanowire. This enhances mechanical stability of the tunneling field-effect transistor.

Optionally, to satisfy a requirement for a dimension of the transistor and achieve Gate-All-Around (GAA) channel depletion, the thickness of the semiconductor nanosheet 120 is less than 15 nanometers, and a thickness of the gate dielectric layer 130 is less than 5 nanometers. In other words, referring to FIG. 1, the thickness of the semiconductor nanosheet 120 in the AA' direction is less than 15 nanometers, and the thickness of the gate dielectric layer 130 in the AA' direction is less than 5 nanometers.

Certainly, the thickness of the semiconductor nanosheet 120 and the thickness of the gate dielectric layer 130 may alternatively be another dimension that may be specifically determined based on a requirement for a driving capability of the transistor. In addition, a length and a height of the semiconductor nanosheet 120 may also be determined based on the requirement for the dimension of the transistor. This is not limited in this embodiment of the present application.

In addition, a material of the tunneling field-effect transistor may be as follows.

Optionally, the semiconductor substrate includes at least one of the following substrates: a bulk silicon substrate, a silicon on insulator SOI substrate, a germanium substrate, a III-V compound material substrate, and the like. This is not limited in this embodiment of the present application.

Alternatively, the semiconductor substrate may include a semiconductor substrate formed by stacking a plurality of types of semiconductor materials. For example, the semiconductor substrate may be originally formed by stacking a second-type doped semiconductor film, a channel-region semiconductor film, and a first-type doped semiconductor film. When the semiconductor nanosheet 120 is formed on the semiconductor substrate, the second-type doped semiconductor film on the semiconductor nanosheet 120 may form the source region 121, the channel-region semiconductor film may form the channel 123, and the first-type doped semiconductor film may form the drain region 122.

Optionally, the source region 121 is formed by performing first-type doping, the drain region 122 is formed by performing second-type doping, and the channel is formed by performing first-type doping or second-type doping. First-type doping is opposite to second-type doping. For example, if first-type doping is N-type doping, second-type doping is P-type doping; or if first-type doping is P-type doping, second-type doping is N-type doping. Moreover, both first-type doping and second-type doping can be implemented through ion injection, and injected ions are of opposite types.

Optionally, the source region 121 may be formed by using the second-type doped semiconductor film, and the drain region 122 may be formed by using the first-type doped semiconductor film.

The first-type doped semiconductor film and the second-type doped semiconductor film are semiconductor films of opposite types. For example, if the first-type doped semiconductor film is an N-type material, the second-type doped semiconductor film is a P-type material. Alternatively, if the first-type doped semiconductor film is a P-type material, the second-type doped semiconductor film is an N-type material.

Optionally, the channel 123 may be formed by using the channel-region semiconductor film, or may be formed by using a bulk silicon material, an SOI material, a germanium material, or the like. This is not limited in this embodiment of the present application.

Optionally, the gate dielectric layer 130 may be formed by using a dielectric material. The dielectric material may be a material with a relatively low dielectric constant, such as silicon dioxide, or may be a dielectric material with a relatively high dielectric constant, such as hafnium oxide and aluminum oxide. The gate metal layer 140 may be formed by using a conductive material. This is not limited in this embodiment of the present application.

Figure 4:
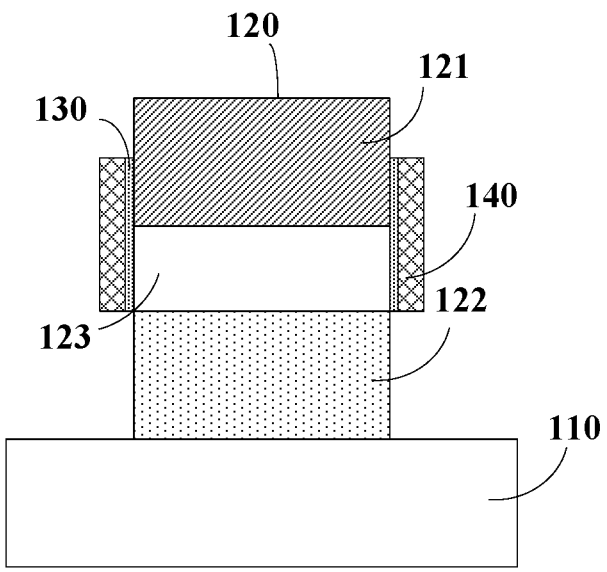
FIG. 4 shows another tunneling field-effect transistor according to Embodiment 1 of the present application.

In a possible implementation, referring to FIG. 3, the gate dielectric layer 130 is not in contact with the source region 121. In another possible implementation, referring to FIG. 4, the gate dielectric layer 130 is in contact with the source region 121. To be specific, the gate region (the gate dielectric layer and the gate metal layer) is extended to the source region. In this case, the gate region may not only surround the channel 123, but also surround a part of the source region 121.

A contact region between the gate region and the source region is a line tunneling region, and a line tunneling field-effect transistor is formed. The gate region can modulate a part of the source region 121 through an electric field, that is, modulate the contact region between the source region 121 and the gate region.

Because a subthreshold swing and a driving capability of a device are optimized, a subthreshold slope of the line tunneling field-effect transistor is smaller than that of a conventional tunneling field-effect transistor. In this case, a steep subthreshold transition region can be maintained.

Figure 5:
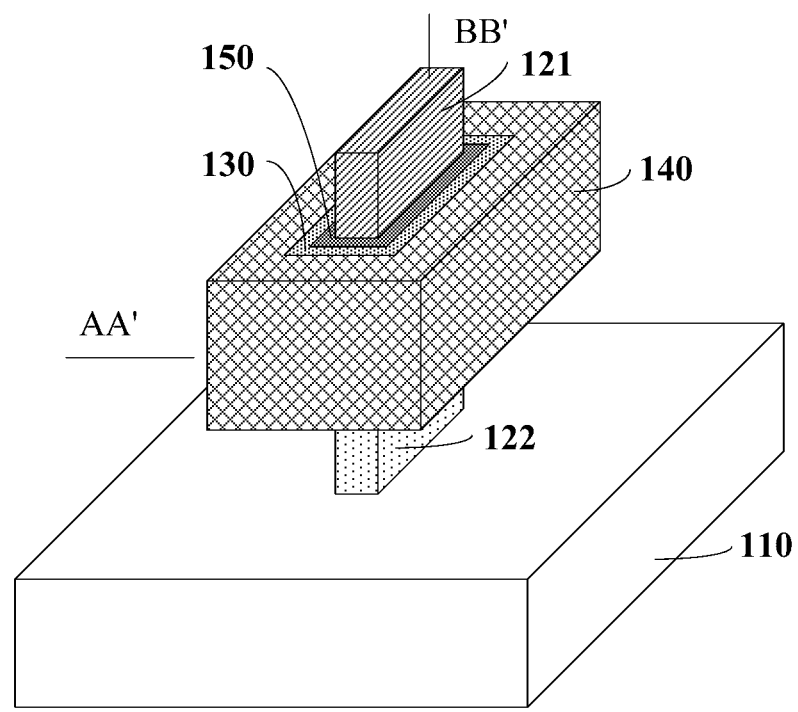
FIG. 5 is a schematic structural diagram of another tunneling field-effect transistor according to Embodiment 1 of the present application.
Figure 6:
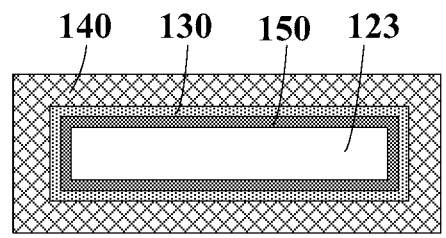
FIG. 6 is a sectional view obtained by cutting the another tunneling field-effect transistor according to Embodiment 1 of the present application along an AA' direction in FIG. 5.
Figure 7:
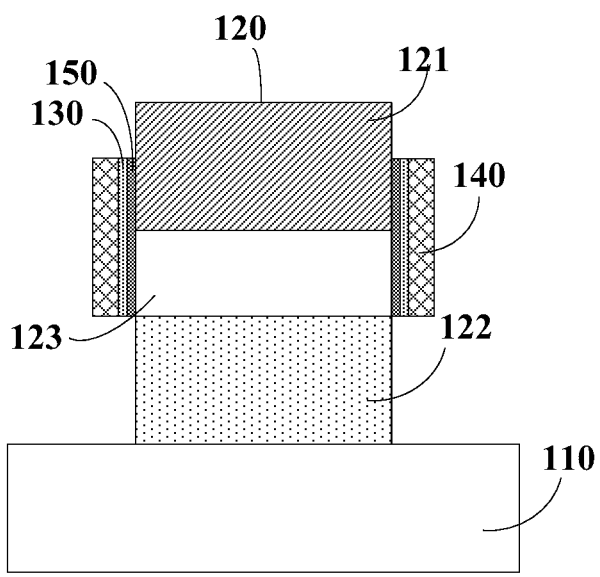
FIG. 7 is a sectional view obtained by cutting the another tunneling field-effect transistor according to Embodiment 1 of the present application along a BB' direction in FIG. 5.

FIG. 5 is a schematic structural diagram of another tunneling field-effect transistor according to Embodiment 1 of the present application. FIG. 6 is a sectional view obtained by cutting the another tunneling field-effect transistor according to Embodiment 1 of the present application along an AA' direction in FIG. 5. FIG. 7 is a sectional view obtained by cutting the another tunneling field-effect transistor according to Embodiment 1 of the present application along a BB' direction in FIG. 5.

Referring to FIG. 5 to FIG. 7, the tunneling field-effect transistor further includes a pocket layer 150. The pocket layer 150 is disposed on surfaces of the source region 121 and the channel 123, surrounds the channel 123, and is in contact with the source region 121. The gate dielectric layer 130 is disposed on a surface of the pocket layer 150 and surrounds the pocket layer 150. The gate dielectric layer 130 and the pocket layer 150 constitute a dielectric layer.

A thickness of the pocket layer 150 may be less than 5 nanometers, or may have another dimension that may be specifically determined depending on a requirement. No limitation is imposed on a dimension of the pocket layer 150 in this embodiment of the present application. The pocket layer 150 may be made of a semiconductor material, and a doping type of the semiconductor material is opposite to a doping type of the source region. Certainly, the pocket layer 150 may alternatively be made of another material. No limitation is imposed on a material of the pocket layer 150 in this embodiment of the present application.

Referring to FIG. 7, the pocket layer 150 may be in contact with the source region 121 to form a line tunneling field-effect transistor. Tunneling efficiency can be improved by disposing the pocket layer 150. Certainly, the pocket layer 150 may alternatively not be in contact with the source region 121. This is not limited in this embodiment of the present application.

Embodiment 2

Figure 8:
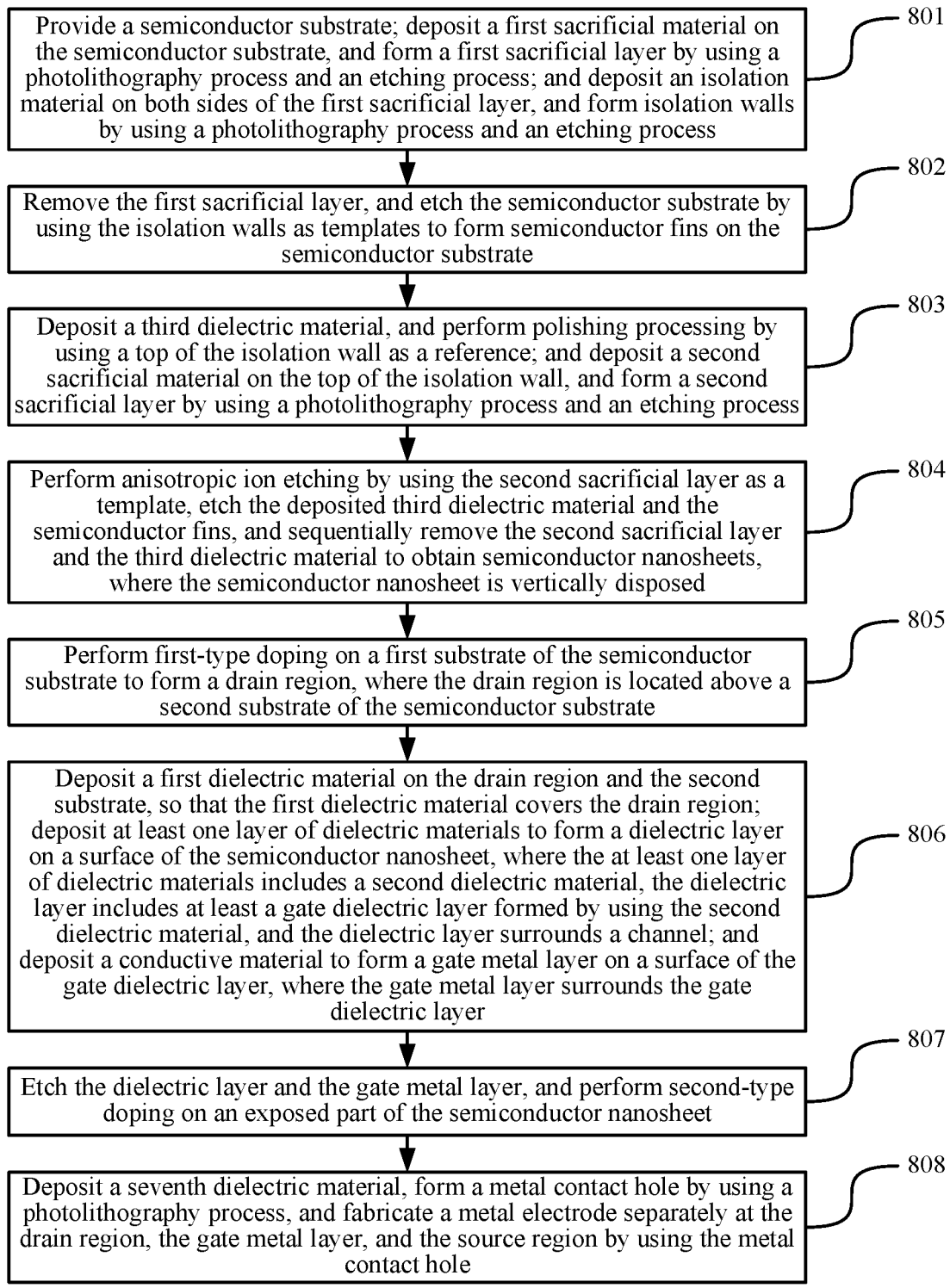
FIG. 8 is a flowchart of a fabrication method of a tunneling field-effect transistor according to Embodiment 2 of the present application.

FIG. 8 is a flowchart of a fabrication method of a tunneling field-effect transistor according to Embodiment 2 of the present application. The method is used to fabricate the tunneling field-effect transistor provided in Embodiment 1, and includes the following steps.

Figure 9:
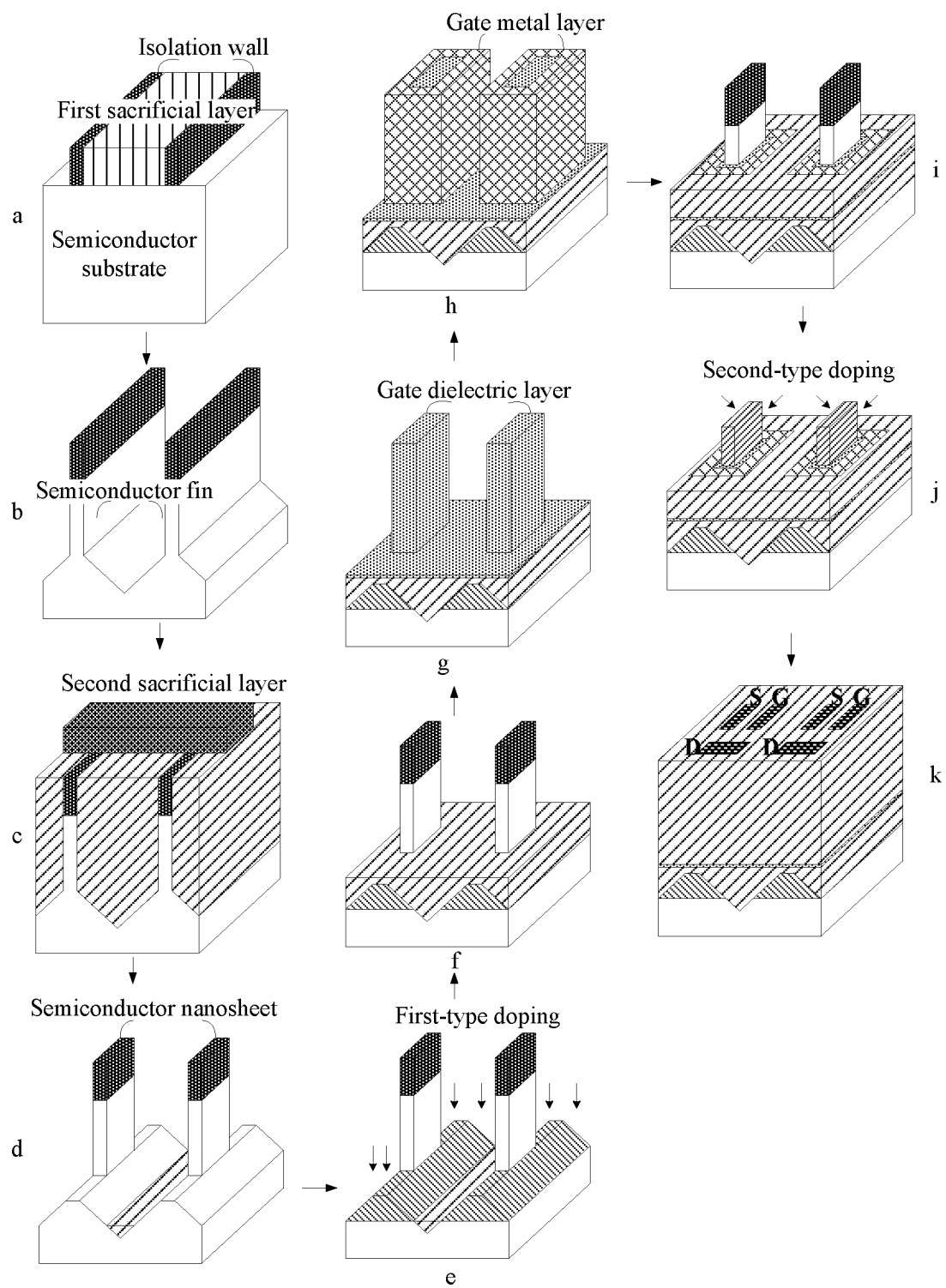
FIG. 9 is a schematic structural diagram, of a tunneling field-effect transistor, shown when each step in a fabrication method of a tunneling field-effect transistor according to Embodiment 3 of the present application is completed.

801. As shown in part a of FIG. 9, provide a semiconductor substrate; deposit a first sacrificial material on the semiconductor substrate, and form a first sacrificial layer by using a photolithography process and an etching process; and deposit an isolation material on both sides of the first sacrificial layer, and form isolation walls by using a photolithography process and an etching process.

In other words, the semiconductor substrate is first provided, the first sacrificial material is deposited on a surface of the semiconductor substrate, and the first sacrificial layer is formed by using the photolithography process and the etching process; and then the isolation material is deposited on both sides of the first sacrificial layer, and the isolation walls are obtained by etching both sides of the first sacrificial layer by using an anisotropic etching technology.

A material of the semiconductor substrate may be a bulk silicon material, an SOI material, a germanium material, a III-V compound material, or the like. No specific limitation is imposed on the material of the semiconductor substrate in the present application.

The isolation material is an ion-etching-resistant material. During an ion etching process, it can be ensured that a silicon material under the isolation material does not be etched.

In addition, the semiconductor nanosheets are subsequently formed by using the isolation walls as templates, and a thickness of the isolation wall is a thickness of the semiconductor nanosheet. Therefore, during etching for obtaining the isolation walls, the thickness of the isolation wall needs to be controlled based on a requirement for the thickness of the semiconductor nanosheet. Optionally, the thickness of the isolation wall is less than 15 nanometers, or may be another dimension. This is not limited in this embodiment of the present application.

Based on dimension characteristics of the tunneling field-effect transistor to be fabricated, the photolithography process may be an ordinary photolithography process, or may be an electron beam lithography photolithography process. The etching process includes plasma etching and the like. This is not limited in the present application.

802. As shown in part b of FIG. 9, remove the first sacrificial layer, and etch the semiconductor substrate by using the isolation walls as templates to form semiconductor fins on the semiconductor substrate.

Specifically, the isolation walls are used as the templates, a groove structure with a specific angle is first formed by using anisotropic etching, as shown in part b of FIG. 9. Then, the semiconductor fins are formed by using anisotropic etching, as shown in part b of FIG. 9, so as to form a structure shown in part b of FIG. 9.

The groove structure is located between the two isolation walls formed on the semiconductor substrate. The specific angle may be 45°, or may be another angle. This is not limited in this embodiment of the present application.

803. As shown in part c of FIG. 9, deposit a third dielectric material, and perform polishing processing by using a top of the isolation wall as a reference; and deposit a second sacrificial material on the top of the isolation wall, and form a second sacrificial layer by using a photolithography process and an etching process.

The third dielectric material is deposited on the structure shown in part b of FIG. 9, and polishing processing is performed, by using the top of the isolation wall as a reference, on a structure obtained after depositing is performed. Then, the second sacrificial material is deposited on the top of the isolation wall, and the second sacrificial layer is formed by using the photolithography process and the etching process.

The third dielectric material may be a low-k material, that is, a material with a relatively low dielectric constant, such as silicon dioxide. The second sacrificial material may be an ion-etching-resistant material different from a material of the isolation wall. This can ensure that silicon material and the isolation walls under the second sacrificial material are not etched. For example, the second sacrificial material may be a polysilicon material or the like. This is not limited in this embodiment of the present application.

The second sacrificial layer and the semiconductor fin cross with each other, and the semiconductor fin may be etched by using the second sacrificial layer as a template to form the semiconductor nanosheet. A length of the second sacrificial layer is a length of the semiconductor nanosheet, and therefore during etching for obtaining the second sacrificial layer, the length of the second sacrificial layer is controlled based on a requirement for the length of the semiconductor nanosheet. No limitation is imposed on the length of the second sacrificial layer in this embodiment of the present application.

804. As shown in part d of FIG. 9, perform anisotropic ion etching by using the second sacrificial layer as a template, etch the deposited third dielectric material and the semiconductor fins, and sequentially remove the second sacrificial layer and the third dielectric material to obtain semiconductor nanosheets, where the semiconductor nanosheet is vertically disposed.

After step 804, the method may further include: depositing a fifth dielectric material and etching the fifth dielectric material, so that the fifth dielectric material can be deposited in the groove structure, where the fifth dielectric material is used to isolate the two semiconductor nanosheets obtained by using the two semiconductor fins.

805. As shown in part e of FIG. 9, perform first-type doping on a first substrate of the semiconductor substrate to form a drain region, where the drain region is located above a second substrate of the semiconductor substrate.

The first substrate is a part of the semiconductor substrate, is located under the semiconductor nanosheet, and is in contact with the semiconductor nanosheet. The second substrate is a part, of the semiconductor substrate, remaining after the first substrate is excluded from the semiconductor substrate. The first substrate and the second substrate constitute the semiconductor substrate.

First-type doping may be implemented through ion injection. Current ion injection is vertical injection, to ensure that ions can be injected into the semiconductor substrate under the semiconductor nanosheet, without being injected into the semiconductor nanosheet.

The fifth dielectric material may fill a part of the groove structure, to ensure that the remaining part of the groove structure may form the drain region through ion injection. In other words, doping of the drain region is implemented by using a steep slope in the groove structure, without affecting another region.

806. As shown in parts f to h of FIG. 9, deposit a first dielectric material on the drain region and the second substrate, so that the first dielectric material covers the drain region; deposit at least one layer of dielectric materials to form a dielectric layer on a surface of the semiconductor nanosheet, where the at least one layer of dielectric materials includes a second dielectric material, the dielectric layer includes at least a gate dielectric layer formed by using the second dielectric material, and the dielectric layer surrounds a channel; and deposit a conductive material to form a gate metal layer on a surface of the gate dielectric layer, where the gate metal layer surrounds the gate dielectric layer.

In a possible implementation, the first dielectric material is deposited on the surface of the semiconductor substrate in a structure shown in part e of FIG. 9. In other words, the first dielectric material is deposited on the drain region and the second substrate, so that the first dielectric material covers the drain region to form a structure shown in part f of FIG. 9. Then, the second dielectric material is deposited on the surface of the semiconductor substrate and on the semiconductor nanosheet, and the gate dielectric layer is formed on the surface of the semiconductor nanosheet to form a structure shown in part g of FIG. 9. Then, the conductive material is deposited; the conductive material on the surface of the semiconductor substrate is removed by using anisotropic etching, and only the conductive material on the surface of the gate dielectric layer is left; and the gate metal layer is formed on the surface of the gate dielectric layer to form a structure shown in part h of FIG. 9, so as to form a gate-all-around tunneling field-effect transistor.

The second dielectric material may be a low-k material such as silicon dioxide, or may be a high-k material such as hafnium oxide or aluminum oxide. In addition, a thickness of the second dielectric material is less than 5 nanometers, or may be another dimension. No limitation is imposed on the second dielectric material and the thickness of the second dielectric material in this embodiment of the present application. The conductive material may be a conductive material such as metal, polysilicon, or silicide. No limitation is imposed on the conductive material in the present application.

In another possible implementation, the first dielectric material is deposited on the surface of the semiconductor substrate in a structure shown in part e of FIG. 9. In other words, the first dielectric material is deposited on the drain region and the second substrate, so that the first dielectric material covers the drain region to form a structure shown in part f of FIG. 9. Then, a fourth dielectric material is deposited, a pocket layer is formed on the surface of the semiconductor nanosheet; a second dielectric material is deposited, a gate dielectric layer is formed on a surface of the pocket layer, the gate dielectric layer surrounds the pocket layer, and the pocket layer and the gate dielectric layer constitute a dielectric layer; and a conductive material is deposited to form a gate metal layer on the surface of the gate dielectric layer.

807. Etch the dielectric layer and the gate metal layer, and perform second-type doping on an exposed part of the semiconductor nanosheet.

When the dielectric layer includes only the gate dielectric layer and does not include the pocket layer, etching the dielectric layer and the gate metal layer means etching the gate dielectric layer and the gate metal layer. When the dielectric layer includes the gate dielectric layer and the pocket layer, etching the dielectric layer and the gate metal layer means etching the pocket layer, the gate dielectric layer, and the gate metal layer.

During etching, a sixth dielectric material may be first deposited, and polishing processing is performed; plasma etching is performed on a generated structure; the sixth dielectric material, the dielectric layer, and the gate metal layer may be simultaneously etched to expose the isolation wall and a part of the semiconductor nanosheet; and the isolation wall is removed, and second-type doping is performed on the exposed part of the semiconductor nanosheet to form the source region. The sixth dielectric material may be a low-k material or the like. This is not limited in this embodiment of the present application.

Second-type doping may be implemented through ion injection, and second-type doping is opposite to first-type doping. For example, if first-type doping is N-type doping, second-type doping is P-type doping; or if first-type doping is P-type doping, second-type doping is N-type doping.

A height of the exposed part of the semiconductor nanosheet is a height of a source region subsequently formed. In other words, a difference between an etching height and a height of the isolation wall is the height of the source region. Therefore, during etching, the etching height may be controlled based on the height of the isolation wall and the height of the source region.

808. Deposit a seventh dielectric material, form a metal contact hole by using a photolithography process, and fabricate a metal electrode separately at the drain region, the gate metal layer, and the source region by using the metal contact hole.

After the source region, the gate metal layer, and the drain region are formed, the seventh dielectric material may be deposited, and polishing processing is performed; the metal contact hole is formed by using the photolithography process; and the metal electrodes are fabricated at the drain region, the gate metal layer, and the source region by using the metal contact hole. In this case, fabrication of the tunneling field-effect transistor is completed.

According to the method provided in this embodiment of the present application, the tunneling field-effect transistor is fabricated by using the semiconductor nanosheet instead of a plurality of nanowires connected in parallel. This improves a current driving capability, decreases circuit design complexity and fabrication complexity, simplifies a fabrication process, and reduces process costs. In addition, an aspect ratio of the semiconductor nanosheet is less than that of the nanowire, and therefore mechanical stability of the semiconductor nanosheet is higher than that of the nanowire. This enhances mechanical stability of the tunneling field-effect transistor.

In the foregoing Embodiment 2, that the source region and the drain region are formed through ion injection is merely used as an example. Actually, the source region and the drain region may alternatively be directly fabricated by using a semiconductor substrate including a first-type doped semiconductor film and a second-type doped semiconductor film, without performing ion injection. A specific method is described in detail in the following Embodiment 3.

Embodiment 3

Figure 10:
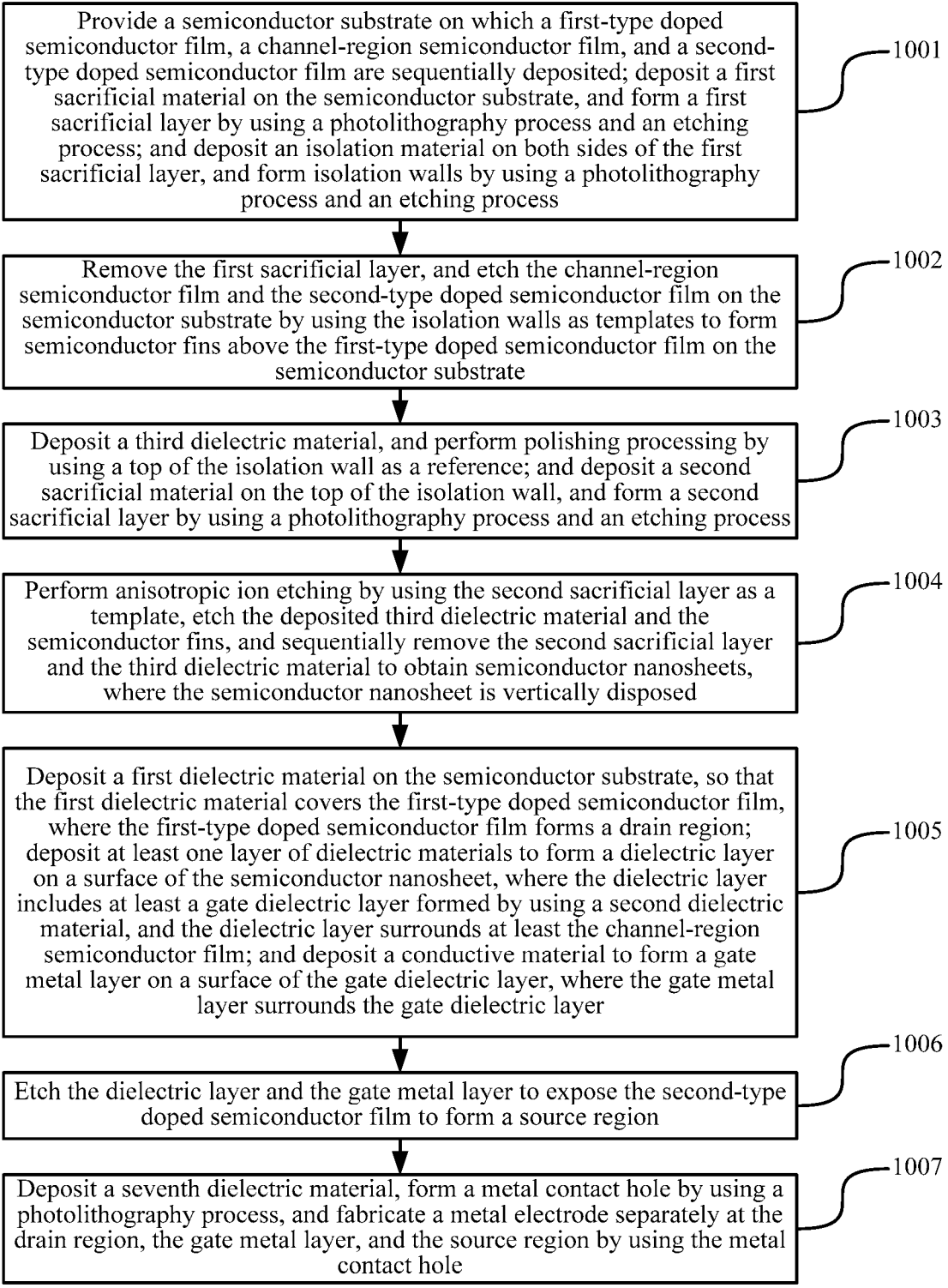
FIG. 10 is a flowchart of a fabrication method of a tunneling field-effect transistor according to Embodiment 3 of the present application.

FIG. 10 is a flowchart of a fabrication method of a tunneling field-effect transistor according to Embodiment 3 of the present application. The method is used to fabricate the tunneling field-effect transistor provided in Embodiment 1, and includes the following steps.

1001. Provide a semiconductor substrate on which a first-type doped semiconductor film, a channel-region semiconductor film, and a second-type doped semiconductor film are sequentially deposited; deposit a first sacrificial material on the semiconductor substrate, and form a first sacrificial layer by using a photolithography process and an etching process; and deposit an isolation material on both sides of the first sacrificial layer, and form isolation walls by using a photolithography process and an etching process.

Figure 11:
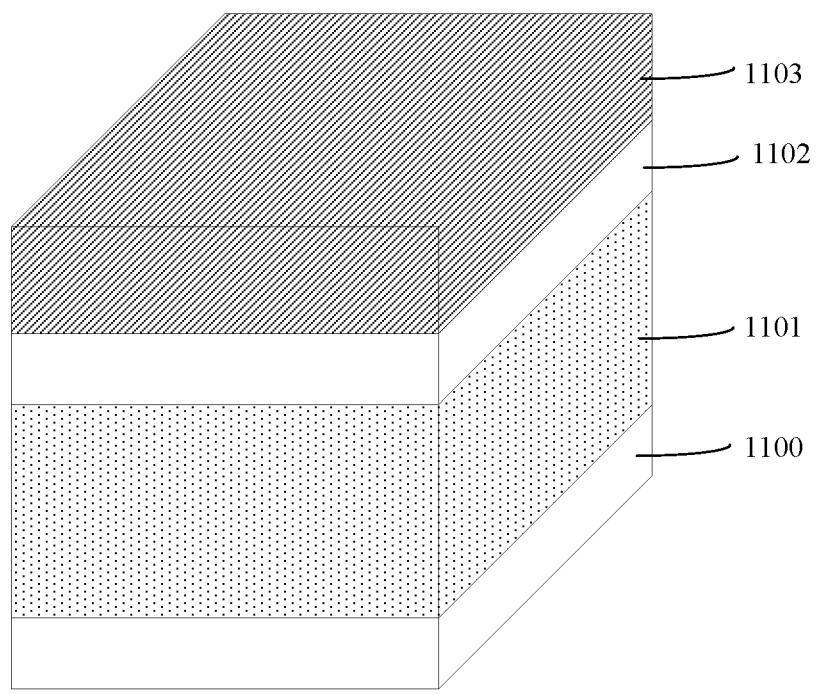
FIG. 11 is a schematic diagram of a material of a semiconductor substrate according to Embodiment 3 of the present application.

Referring to FIG. 11, a semiconductor substrate 1100 provided in this embodiment of the present application includes a first-type doped semiconductor film 1101, a channel-region semiconductor film 1102, and a second-type doped semiconductor film 1103. Therefore, in a subsequent fabrication process, a drain region, a channel, and a source region can be formed without performing ion injection. The first-type doped semiconductor film 1101 and the second-type doped semiconductor film 1103 are made of materials of opposite types. For example, if the first-type doped semiconductor film 1101 is an N-type material, the second-type doped semiconductor film 1103 is a P-type material. Alternatively, if the first-type doped semiconductor film 1101 is a P-type material, the second-type doped semiconductor film 1103 is an N-type material. The channel-region semiconductor film 1102 may be the first-type doped semiconductor film, or may be the second-type doped semiconductor film.

1002. Remove the first sacrificial layer, and etch the channel-region semiconductor film and the second-type doped semiconductor film on the semiconductor substrate by using the isolation walls as templates to form semiconductor fins above the first-type doped semiconductor film on the semiconductor substrate.

1003. Deposit a third dielectric material, and perform polishing processing by using a top of the isolation wall as a reference; and deposit a second sacrificial material on the top of the isolation wall, and form a second sacrificial layer by using a photolithography process and an etching process.

1004. Perform anisotropic ion etching by using the second sacrificial layer as a template, etch the deposited third dielectric material and the semiconductor fins, and sequentially remove the second sacrificial layer and the third dielectric material to obtain semiconductor nanosheets, where the semiconductor nanosheet is vertically disposed.

It should be noted that, the foregoing steps 1001 to 1004 are similar to the foregoing steps 801 to 804, a difference therebetween lies only in that materials used for the semiconductor substrates are different, and details are not described herein again.

1005. Deposit a first dielectric material on the semiconductor substrate, so that the first dielectric material covers the first-type doped semiconductor film, where the first-type doped semiconductor film forms a drain region; deposit at least one layer of dielectric materials to form a dielectric layer on a surface of the semiconductor nanosheet, where the at least one layer of dielectric materials includes a second dielectric material, the dielectric layer includes at least a gate dielectric layer formed by using the second dielectric material, and the dielectric layer surrounds the channel-region semiconductor film; and deposit a conductive material to form a gate metal layer on a surface of the gate dielectric layer, where the gate metal layer surrounds the gate dielectric layer.

In a possible implementation, the depositing at least one layer of dielectric materials to form a dielectric layer on a surface of the semiconductor nanosheet includes: depositing the second dielectric material to form the gate dielectric layer on the surface of the semiconductor nanosheet.

In another possible implementation, the depositing at least one layer of dielectric materials to form a dielectric layer on a surface of the semiconductor nanosheet includes: depositing a fourth dielectric material to form a pocket layer on the surface of the semiconductor nanosheet; and depositing the second dielectric material to form the gate dielectric layer on a surface of the pocket layer, where the gate dielectric layer surrounds the pocket layer, and the pocket layer and the gate dielectric layer constitute the dielectric layer.

1006. Etch the dielectric layer and the gate metal layer to expose the second-type doped semiconductor film to form a source region.

Specifically, the sixth dielectric material is filled, and polishing processing is performed; and the sixth dielectric material, the gate metal layer, and the dielectric layer are etched to expose the second-type doped semiconductor film. The second-type doped semiconductor film forms the source region.

When the dielectric layer includes only the gate dielectric layer and does not include the pocket layer, etching the dielectric layer and the gate metal layer means etching the gate dielectric layer and the gate metal layer. When the dielectric layer includes the gate dielectric layer and the pocket layer, etching the dielectric layer and the gate metal layer means etching the pocket layer, the gate dielectric layer, and the gate metal layer.

During etching of the dielectric layer and the gate metal layer, an etching height may be equal to a height of the second-type doped semiconductor film, so that the second-type doped semiconductor film is exposed, and it can be ensured that the dielectric layer is not in contact with the second-type doped semiconductor film. Alternatively, an etching height may be less than a height of the second-type doped semiconductor film, so that the second-type doped semiconductor film is exposed and the dielectric layer is in contact with the second-type doped semiconductor film to form a line tunneling field-effect transistor.

1007. Deposit a seventh dielectric material, form a metal contact hole by using a photolithography process, and fabricate a metal electrode separately at the drain region, the gate metal layer, and the source region by using the metal contact hole.

It should be noted that the foregoing steps 1005 to 1007 are similar to the foregoing steps 806 to 808, a difference therebetween lies only in that doping is not needed in this embodiment of the present application, and a specific process is not described herein again.

According to the method provided in this embodiment of the present application, the tunneling field-effect transistor is fabricated by using the semiconductor nanosheet instead of a plurality of nanowires connected in parallel. This improves a current driving capability, decreases circuit design complexity and fabrication complexity, simplifies a fabrication process, and reduces process costs. In addition, an aspect ratio of the semiconductor nanosheet is less than that of the nanowire, and therefore mechanical stability of the semiconductor nanosheet is higher than that of the nanowire. This enhances mechanical stability of the tunneling field-effect transistor.

In the prior art, a gate-all-around tunneling field-effect transistor is usually fabricated by using vertical gate nanowires connected in parallel. However, there are the following problems due to parallel connection of the nanowires:

(1) The parallel connection of the nanowires leads to an increase in circuit design complexity and fabrication complexity. In addition, due to the parallel connection of the nanowires, a new design parameter is used, such as a nanowire pitch, resulting in a new challenge to fabrication of a subsequent gate stack layer if the nanowire pitch is relatively small.

(2) Due to a relatively small diameter, a thin and long nanowire with a high aspect ratio may be tilted during a fabrication process, resulting in a mechanical stability problem.

(3) A nanowire is usually fabricated by using a photolithography process. However, there is no photolithography process for fabricating a sufficiently thin nanowire. Therefore, it is difficult to satisfy a process requirement, and complexity of a device fabrication process and a process variation factor introduced therein are increased.

In the embodiments of the present application, the following effects can be achieved by using the semiconductor nanosheet instead of nanowires connected in parallel:

(1) Circuit design complexity and fabrication complexity are decreased, a fabrication process is simplified, and process costs are reduced.

(2) An aspect ratio of the semiconductor nanosheet is less than that of the nanowire. Therefore, the semiconductor nanosheet is not easily tilted during a fabrication process, and mechanical stability of the semiconductor nanosheet is higher than that of the nanowire. This enhances mechanical stability of the tunneling field-effect transistor.

(3) In the fabrication process, the semiconductor nanosheet is formed by using a film deposition technology instead of using a photolithography process, improving fabrication accuracy.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely examples of embodiments of the present application, but are not intended to limit the present application. Any modification, equivalent replacement, and improvement made without departing from the spirit and principle of the present application shall fall within the protection scope of the present application.

What is claimed is:

1. A fabrication method of a tunneling field-effect transistor, wherein the method comprises:
    providing a semiconductor substrate;
    forming semiconductor fins on the semiconductor substrate;
    etching the semiconductor fins to obtain a semiconductor nanosheet, wherein the semiconductor nanosheet is vertically disposed;
    performing first-type doping on a first substrate of the semiconductor substrate to form a drain region, wherein the drain region is located above a second substrate of the semiconductor substrate, the first substrate is a part of the semiconductor substrate, is located under the semiconductor nanosheet, and is in contact with the semiconductor nanosheet, and the second substrate is a part, of the semiconductor substrate, remaining after the first substrate is excluded from the semiconductor substrate;
    depositing a first dielectric material on the drain region and the second substrate, wherein the first dielectric material covers the drain region;
    depositing at least one layer of dielectric materials to form a dielectric layer on a surface of the semiconductor nanosheet, wherein the at least one layer of dielectric materials comprises a second dielectric material, the dielectric layer comprises at least a gate dielectric layer formed by using the second dielectric material, and the dielectric layer surrounds a channel;

depositing a conductive material to form a gate metal layer on a surface of the gate dielectric layer, wherein the gate metal layer surrounds the gate dielectric layer;

etching the dielectric layer and the gate metal layer; and performing second-type doping on an exposed part of the nanosheet to form a source region.

2. The method according to claim 1, wherein the forming semiconductor fins on the semiconductor substrate comprises:

depositing a first sacrificial material on the semiconductor substrate;

forming a first sacrificial layer using a first photolithography process and a first etching process;

depositing an isolation material on both sides of the first sacrificial layer;

forming isolation walls using a second photolithography process and a second etching process;

removing the first sacrificial layer; and etching the semiconductor substrate using the isolation walls as templates to form the semiconductor fins on the semiconductor substrate.

3. The method according to claim 1, wherein the etching the semiconductor fins to obtain a semiconductor nanosheet comprises:

depositing a third dielectric material;

performing polishing processing using a top of an isolation wall as a reference;

depositing a second sacrificial material on the top of the isolation wall;

forming a second sacrificial layer using a photolithography process and an etching process;

etching the deposited third dielectric material and the semiconductor fins using the second sacrificial layer as a template; and sequentially removing the second sacrificial layer and the third dielectric material to obtain the semiconductor nanosheet.

4. The method according to claim 2, where the method further comprises:

forming, on the semiconductor substrate, a groove structure with a specific angle using anisotropic etching, wherein the groove structure is located between the isolation walls formed on the semiconductor substrate.

5. The method according to claim 1, wherein the depositing at least one layer of dielectric materials to form a dielectric layer on a surface of the semiconductor nanosheet comprises:

depositing a fourth dielectric material to form a pocket layer on the surface of the semiconductor nanosheet; and depositing the second dielectric material to form the gate dielectric layer on a surface of the pocket layer, wherein the gate dielectric layer surrounds the pocket layer, and the pocket layer and the gate dielectric layer constitute the dielectric layer.

6. The method according to claim 5, wherein the etching the dielectric layer and the gate metal layer; and performing second-type doping on an exposed part of the nanosheet to form a source region comprises:

etching the pocket layer, the gate dielectric layer, and the gate metal layer; and performing the second-type doping on the exposed part of the nanosheet to form the source region.

7. A fabrication method of a tunneling field-effect transistor, wherein the method comprises:

providing a semiconductor substrate on which a first-type doped semiconductor film, a channel-region semiconductor film, and a second-type doped semiconductor film are sequentially deposited;

forming semiconductor fins above the first-type doped semiconductor film on the semiconductor substrate, wherein the semiconductor fins comprise the channel-region semiconductor film and the second-type doped semiconductor film;

etching the semiconductor fins to obtain a semiconductor nanosheet, wherein the semiconductor nanosheet is vertically disposed;

depositing a first dielectric material on the semiconductor substrate, wherein the first dielectric material covers the first-type doped semiconductor film;

depositing at least one layer of dielectric materials to form a dielectric layer on a surface of the semiconductor nanosheet, wherein the at least one layer of dielectric materials comprises a second dielectric material, the dielectric layer comprises at least a gate dielectric layer formed using the second dielectric material, and the dielectric layer surrounds the channel-region semiconductor film;

depositing a conductive material to form a gate metal layer on a surface of the gate dielectric layer, wherein the gate metal layer surrounds the gate dielectric layer; and etching the dielectric layer and the gate metal layer to expose the second-type doped semiconductor film.

8. The method according to claim 7, wherein the forming semiconductor fins above the first-type doped semiconductor film on the semiconductor substrate comprises:

depositing a first sacrificial material on the semiconductor substrate;

forming a first sacrificial layer using a first photolithography process and a first etching process;

depositing an isolation material on both sides of the first sacrificial layer;

forming isolation walls using a second photolithography process and a second etching process;

removing the first sacrificial layer; and etching the channel-region semiconductor film and the second-type doped semiconductor film on the semiconductor substrate using the isolation walls as templates to form the semiconductor fins above the first-type doped semiconductor film.

9. The method according to claim 7, wherein the etching the semiconductor fins to obtain a semiconductor nanosheet comprises:

depositing a third dielectric material;

performing polishing processing using a top of an isolation wall as a reference;

depositing a second sacrificial material on the top of the isolation wall;

forming a second sacrificial layer using a photolithography process and an etching process;

etching the deposited third dielectric material and the semiconductor fins using the second sacrificial layer as a template; and sequentially removing the second sacrificial layer and the third dielectric material to obtain the semiconductor nanosheets.

10. The method according to claim 8, where the method further comprises:

forming, on the semiconductor substrate, a groove structure with a specific angle using anisotropic etching, wherein the groove structure is located between the isolation walls formed on the semiconductor substrate.

11. The method according to claim 7, wherein:

during etching of the dielectric layer and the gate metal layer, an etching height is equal to a height of the second-type doped semiconductor film, wherein the second-type doped semiconductor film is exposed; or during etching of the dielectric layer and the gate metal layer, an etching height is less than a height of the second-type doped semiconductor film, wherein the second-type doped semiconductor film is exposed and the dielectric layer is in contact with the second-type doped semiconductor film.

12. The method according to claim 7, wherein the depositing at least one layer of dielectric materials to form a dielectric layer on a surface of the semiconductor nanosheet comprises:

depositing a fourth dielectric material to form a pocket layer on the surface of the semiconductor nanosheet; and depositing the second dielectric material to form the gate dielectric layer on a surface of the pocket layer, wherein the gate dielectric layer surrounds the pocket layer, and the pocket layer and the gate dielectric layer constitute the dielectric layer.

\* \* \* \* \*